United States Patent
Renk et al.

[19]

[11] Patent Number: 6,086,726

[45] Date of Patent: Jul. 11, 2000

[54] METHOD OF MODIFYING A SURFACE

[75] Inventors: Timothy J. Renk; Neil R. Sorensen; Donna Cowell Senft, all of Albuquerque, N. Mex.; Rudolph G. Buchheit, Jr., Columbus, Ohio; Michael O. Thompson, Ithaca, N.Y.; Kenneth S. Grabowski, Alexandria, Va.

[73] Assignee: Sandia Corporation, Albuquerque, N. Mex.

[21] Appl. No.: 09/082,288

[22] Filed: May 19, 1998

[51] Int. Cl.[7] .......................... C23C 14/16; C23C 14/58; C23C 14/46

[52] U.S. Cl. ..................................... 204/192.1; 427/376.5; 427/376.6; 427/376.7; 427/376.8; 427/533; 427/535; 427/539; 427/551; 427/552; 427/553; 427/555; 427/556; 427/559; 427/372.2; 427/331; 427/375; 427/376.1; 427/376.2; 427/376.3; 427/376.4; 204/192.1; 204/157.15; 250/492.21; 250/492.3; 250/492.1; 148/565; 156/272.2; 156/272.6; 438/485; 438/535; 438/557

[58] Field of Search ............................ 204/192.1, 192.11, 204/157.15, 157.63; 250/492.21, 492.3, 492.1; 148/565; 29/6.1; 156/272.2, 272.6; 438/485, 535, 557; 422/372.2, 331, 375, 376.1, 376.2, 376.3, 376.4, 376.5, 376.8, 376.6, 376.7, 383.1, 383.3, 533, 535, 539, 537, 585; 427/551, 552, 553, 555, 556, 559

[56] References Cited

U.S. PATENT DOCUMENTS

| | | |
|---|---|---|
| 4,992,298 | 2/1991 | Deutchman et al. . |
| 5,034,256 | 7/1991 | Santiso, III et al. ...................... 428/73 |
| 5,055,318 | 10/1991 | Deutchman et al. . |
| 5,178,726 | 1/1993 | Yu et al. .................................... 216/66 |
| 5,445,689 | 8/1995 | Kornely ..................................... 148/565 |
| 5,532,495 | 7/1996 | Bloomquist et al. .............. 250/492.21 |
| 5,900,443 | 5/1999 | Stinnett et al. ............................... 522/1 |
| 5,918,140 | 6/1999 | Wickboldt et al. ...................... 438/535 |

OTHER PUBLICATIONS

Baglin et al, "Pulsed Proton Beam Annealing: Semiconductors and Silicides", Nuclear Instruments and Methods, 191, pp. 169–176 (month unknown), 1981.

Harjes, et al, Initial Results from the RHEPP, Sandia National Laboratories, (Date Unknown).

Pogrebynak, Review Article "Metastable States and Structural Phase Changes in Metals and Alloys Exposed to High Power Pulsed Ion Beams," Institute of Nuclear Physics, Tomsk Polytechnical Institute, 1990. (Month Unknown).

*Primary Examiner*—Alan Diamond
*Attorney, Agent, or Firm*—V. Gerald Grafe

[57] ABSTRACT

The present invention provides a surface modification method that provides beneficial changes in surface properties, can modify a surface to a greater depth than previous methods, and that is suitable for industrial application. The present method comprises applying a thin-film coating to a surface of a substrate, then subjecting the coated surface to an ion beam. The ion beam power pulse heats the coated surface, leading to alloying between the material in the coating and the material of the substrate. Rapid cooling of the alloyed layer after an ion beam pulse can lead to formation of metastable alloys and microstructures not accessible by conventional alloying methods or intense ion beam treatment of the substrate alone.

8 Claims, 1 Drawing Sheet

6,086,726

METHOD OF MODIFYING A SURFACE

This invention was made with Government support under Contract DE-AC04-94AL85000 awarded by the U.S. Department of Energy. The Government has certain rights in the invention.

BACKGROUND OF THE INVENTION

This invention relates to the field of modifying surfaces, specifically modifying surfaces by surface alloying of thin-film coatings using pulsed ion beams.

Many applications require materials having different bulk and surface properties. For example, many industrial applications could benefit from the high corrosion resistance of high purity aluminum. Such aluminum, however, has insufficient tensile strength for practical industrial use. Addition of alloying elements such as silicon, copper, and magnesium can improve the mechanical properties of aluminum, but also can act as initiation sites for corrosion. Addition of transition metals such as titanium, zirconium, hafnium, chromium, and niobium, to aluminum alloys can improve corrosion resistance. These metals, however, are largely insoluble in aluminum under equilibrium conditions.

As another example, titanium and associated alloys have excellent corrosion resistance, but wear resistance is a problem. A thin (about 200 Å) hard layer of $TiO_2$ forms on titanium under normal atmospheric conditions, but if this layer is penetrated in a wear application, galling and microwelding can result, leading to a compromise of surface integrity.

Plating of a dissimilar metal onto a surface can be used to change surface properties. Internal stresses of plated layers restrict the attainable thickness, however, and mechanical delamination is a major concern. Delamination or even a small break in the plating can totally compromise performance, for example by allowing environmental contaminants to promote corrosion of the base material under the plated layer.

Electron beams and laser beams can be used to heat a surface and modify its properties. The energy of an electron beam must generally be held to below about 50 kV to produce a suitable melt range. The dynamics of electron beam diodes make it difficult to produce and transport multi-hundred $A/cm^2$ current densities at 50 kV, limiting the use of electron beams for surface heating and modification. Laser beams are generally inefficient to produce, and couple poorly to highly reflective metal surfaces. Also, laser photons do not penetrate in depth beyond the surface, so thermal diffusion is the dominant energy transfer process. Thermal diffusion leads to a sharply peaked thermal profile, limiting the depth of effective surface modification. Further, laser heating can lead to a rough surface that can compromise manufacturing processes that rely on mechanical tolerances.

Ion implantation has also been used to modify surface properties. Conventional ion implantation uses a continuous low current beam that can not transiently heat surface regions. The depth of surface modification available with ion implantation is typically on the order of 250–1000 Angstroms (Å), precluding the use of ion implantation where deeper surface modification is required.

Pulsed intense ion beams can be used to modify surface properties. See, e.g., Pogrebnyak, "Metastable States and Structural Phase Changes in Metals and Alloys Exposed to High Power Ion Beams," Phys. Stat. Sol. (a) 117, 17, 1990. Pulsed ion beams have also been used in surface alloying of thin-film coatings. See Baglin et al., "Pulsed Proton Beam Annealing: Semiconductors and Silicides," Nucl. Instr. and Meth., 1981. Such research, however, has not developed a consistent regimen for improving mechanical properties such as corrosion resistance and durability. Some research has shown beneficial changes in surface hardness, resistance to corrosion, and surface and near-surface morphology and microstructure. Current pulsed ion techniques that do not include surface alloying do not provide sufficient flexibility with respect to the final composition of the surface since they only modify the microstructure of the existing surface.

Accordingly, there is a need for a surface modification method that can provide beneficial changes in surface properties, can modify a surface to a greater depth than previous methods, and that is suitable for industrial application.

SUMMARY OF THE INVENTION

The present invention provides a surface modification method that can produce beneficial changes in surface properties, can modify a surface to a greater depth than previous methods, and that is suitable for industrial application. The present method comprises applying a coating to a surface of a substrate, then irradiating the coated surface with an ion beam. The ion beam power pulse heats both the coating and the substrate, leading to liquid-phase mixing (alloying) of the coating material and the substrate material. Rapid cooling of the surface after an ion beam pulse can lead to formation of metastable phases and microstructures not attainable by conventional alloying methods or ion beam treatment of the substrate alone. The method of the present invention distributes the coated material beyond its original thickness. Consequently, there is no abrupt boundary between coating material and substrate material to cause adhesion or durability problems. The improved surface layer becomes an integral part of the substrate.

Advantages and novel features will become apparent to those skilled in the art upon examination of the following description or may be learned by practice of the invention. The objects and advantages of the invention may be realized and attained by means of the instrumentalities and combinations particularly pointed out in the appended claims.

DESCRIPTION OF THE FIGURES

The accompanying drawings, which are incorporated into and form part of the specification, illustrate embodiments of the invention and, together with the description, serve to explain the principles of the invention.

DETAILED DESCRIPTION OF THE INVENTION

The present invention provides a surface modification method that provides beneficial changes in surface properties, can modify a surface to a greater depth than previous methods, and that is suitable for industrial application.

Figure 1A:
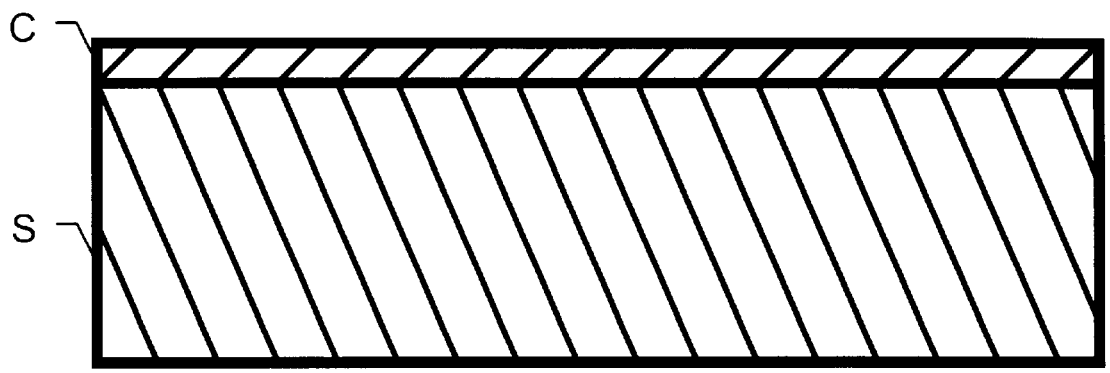
FIGS. 1(a,b) is a cross section of a surface as it is modified according to the present invention.
Figure 1B:
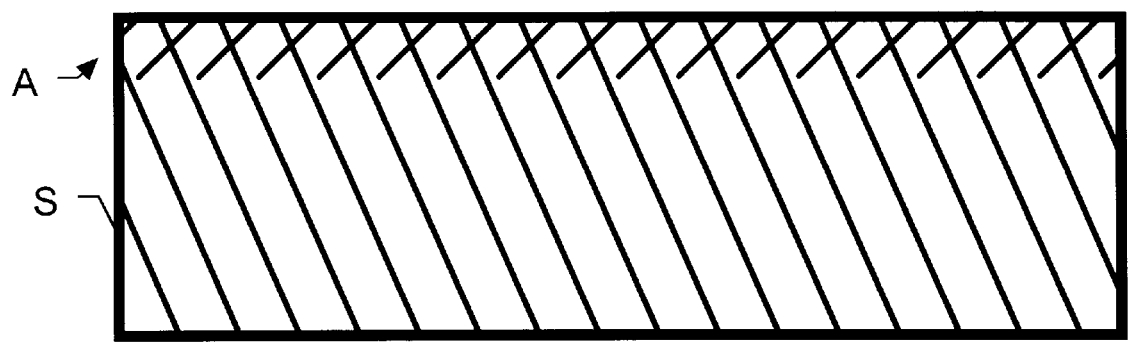

FIGS. 1(a,b) shows a cross section of a surface as it is modified according to the present invention. In FIG. 1a substrate S has coating C applied thereon. The coated surface is then subjected to an ion beam. FIG. 1b shows substrate S after ion beam treatment. Thermal energy from the ion beam has led to alloying A between the material in the coating and material of substrate S. Alloyed portion A of substrate S can have improved properties relative to the rest of substrate S.

The surface alloying process begins with the application of a surface coating to a candidate substrate. A thin-film coating (typically less than 1 micron pure, or a few microns codeposited) can be applied by any compatible method, including, for example, conventional electron beam (E-Beam) evaporation of a metallic target, or sputter deposition of appropriate targets. Sputtered coatings in some instances resist mechanical delamination when beam-treated better than E-Beam evaporated coatings. The thin-film coating can be applied as a pure element of as a locally mixed composition through, for example, multiple sputter targets. For example, instead of a pure 2000 Å layer of silicon deposited on aluminum, a "co-deposited" layer of elemental aluminum and silicon can deposited on aluminum alloy in a predetermined ratio of 20 Atomic % silicon to 80 Atomic % aluminum in a layer 1 micron thick. This amounts to approximately the same quantity of silicon as a 2000 Å pure layer. In some cases a co-deposited layer can yield a harder surface after ion beam treatment than a pure silicon layer. Other coating techniques can be substituted for the relatively expensive E-Beam and sputter deposition processes. For example, a thin-film coating can be applied by applying an organic suspension, although standard painting techniques can result in coatings overly thick coatings and can lead to mechanical delamination.

After the coating is applied, the area to be treated is subjected to one or more pulses of ion beams using species such as hydrogen, nitrogen, carbon, and xenon. A beam source such as RHEPP-1, described in Harjes et al., "Initial Results from the RHEPP Module", in Proc. $9^{th}$ Int. Conf. On High Power Particle Beams (Beams 92), Washington, D.C., 1992, incorporated herein by reference, is suitable for use with the present invention. RHEPP-1 supplies pulsed power to a magnetically insulated ion diode with an ion source operating on a gas-breakdown principle, or to a "flashover" source operating on a surface breakdown principle. In such a diode, ions are accelerated across an applied voltage, while electron leakage is suppressed by a transverse magnetic field. Injected gas is ionized and forms the accelerated beam. The diode surface apparently participates in the process, because the resultant beam can contain ions other than from the injected gas species. For instance, time-of-flight (TOF) analysis of beam signals recorded by Faraday cups arrayed at the target location indicate that the beam formed when xenon is injected appears to contain various charge states of carbon as well as xenon. As another example, when nitrogen is injected, the beam appears initially protonic (about 10% of the total beam), followed by N+2 and N+1 pulses.

A typical voltage pulse from RHEPP-1 peaks at about 600 kV, but can vary from 350 kV to 850 kV. The present invention can operate using beams under 350 kV, but the depositional range would diminish, resulting to a lowered upper fluence limit. Current densities can vary from 10 A/cm$^2$ to 300 A/cm$^2$, depending upon the accelerated species and the distance to the target. Deposited fluences on target range from less than 1 J/cm$^2$ to as much as 10 J/cm$^2$. Below about 1 J/cm$^2$, many surfaces of interest do not sufficiently melt. Above about 10 J/cm$^2$, ablation and material removal can decrease the quantity of material remaining to be mixed into the substrate. With pulses above 1 MV the depositional depth can increase, requiring that the 1 J/cm$^2$ to 10 J/cm$^2$ range be increased. The duration of the "power pulse" on target, that is, the time during which ions of substantial voltage impinge on the target, can vary from 100 nanoseconds to 500 nanoseconds, depending upon the accelerated species and distance to the target.

During the power pulse, incident ions undergo coulomb collisions with the target atoms, which leads to rapid lattice heating. Because the voltage tends to fall during the power pulse, the ion penetration depth gradually diminishes. This leads to an energy deposition profile with depth below the surface that is almost constant down to the maximum stopping range of the incident ions. The deposition duration tends to be short compared to the time scale for significant thermal conduction of heat into the substrate. The resultant thermal pulse leads to rapid melting of a surface layer. The penetration distance of this melt typically exceeds the ion range, due to the effects of thermal conduction after the completion of the power pulse. This thermal conduction to the substrate also leads to a rapid re-solidification of the melted layer, typically $10^{7°}$ K. to $10^{9°}$ K./second. This rapid quench "freezes in" metastable alloy phases and structures formed when the thin-film coating and substrate combine. In particular, metastable alloys can be formed of metals that are normally immiscible under equilibrium conditions, such as chromium in aluminum.

Experiments with the present invention have allowed empirical development of several process guidelines. For example, the mixing process can be most effective when the fluence level is adjusted to produce near-vaporization of the thin-film coated surface. Also, treatment with proton pulses tends to result in enhanced surface hardness, but also a rougher surface topography than that produced by, for example, a nitrogen beam. Beams comprising heavier atomic weight species have been empirically determined to yield smoother surface topography that beams comprising lighter atomic weight species. Further, multiple pulses, on the order of 25 and more, tend to produce improved mixing homogeneity in the processed layer, as indicated by electron microprobe measurements.

Multiple pulsing also tends to reduce the occurrence of beam-induced microcraters. While some of these craters are ascribable to debris originating in the diode and propagating to the test sample, the bulk appear to be produced by response processes within the treated layer. For example, there can be significant dissolved gas in the metal lattice, which can become liberated under the intense heating generated during the beam power pulse. These trapped gases appear to move towards the surface, explosively releasing the trapped gas and leaving corresponding surface craters. It appears that with an extended number of pulses, the bulk of these trapped gases can be liberated from the treated layer, and the surface topography returned to a more nearly smooth surface.

The operational film thickness range of the surface alloying process is related to the melt distance produced by the accelerated ions. Melt depths into the substrate of at least one tenth the coating thickness can yield desirable property improvements. Experiments on the RHEPP-1 accelerator, in which the melt distance can vary from 1.5 microns to as much as 10 microns for iron and aluminum respectively, have involved pure coatings of up to 2 microns in thickness. The pure layer thickness can be some fraction of the melt distance, on the order of 25 to 50%. A thicker layer can stop most of the beam energy within the layer itself. This produces two side-effects: 1) less of the substrate participates in the process, diminishing its role in forming an alloy with the coating and possibly weakening the adhesion properties of the coating; 2) and the melt zone in the substrate becomes too narrow, leading to too high a concentration of the coating metal in the substrate. For example, a 2 micron thick chromium layer on an iron substrate, when ion beam-treated on RHEPP-1, can lead to a melt zone including the entire chromium layer and 0.5 micron to 1 micron of the iron substrate. The chromium, when mixed through the resulting total melted thickness of 2.5 microns to 3 microns, is the dominant element in the alloy. On the other hand, if the pure chromium layer is about 0.5 microns thick, the 0.5 microns of chromium can mix with 2.5 microns of the iron substrate, leading to more incorporation of and improved bonding to the iron substrate.

In the case of co-deposited layers where the mixing ratio is effectively predetermined, the coating thickness may be limited only by the coating procedure itself, for example, by the length of time the sputter guns are operated. There can be some elemental migration of the coating species into the substrate, so that an initial co-deposited ratio can be reduced by the action of beam treatment. Thus the co-deposited ratio can be the maximal ratio that can be expected in a given case.

EXAMPLES

Platinum on Ti-2 (Commercially Pure Titanium) and Ti-5 (Titanium Alloyed With Vanadium and Aluminum)

Up to 2 micron of platinum has been mixed into these titanium alloys, producing alloyed concentrations of as much as 30 atomic % platinum. This should be compared with an equilibrium solubility of about 1% of platinum in α-Ti. We have seen enhanced passivation including higher resistance to pitting in an aggressive environment (NaBr), indicating improvements in corrosion resistance over the equivalent non-coated, non-treated titanium. We have also measured increased hardness (by nano-indentation), as well as increased wear durability as measured by a linear reciprocating tribometer using a ball-on-flat geometry. X-Ray Diffraction (XRD) measurements show that the titanium has remained largely in the α-state, and that there are new lines that may indicate new metastable states or intermetallic structures. The α-state observation is important, since conversion of the titanium to the β-phase might explain the enhanced solubility of the platinum. The solubility of platinum in β-phase titanium is 44%. We have also experimented with additions of niobium and palladium to the base titanium alloy.

The treatment regime comprised 25–50 ion beam pulses, although surface property improvement was obtained with as many as 200 ion beam pulses. There was no clear indication that 200 ion beam pulses was better than 25 ion beam pulses. Surface property improvement was obtained with a nitrogen beam at fluence levels between 1.5 J/cm$^2$ and 3 J/cm$^2$. 0.3 micron to 2 micron thick pure coatings were used. With co-sputtering, the only limit is the adhesion of the sputtered layers. 1 micron thick co-sputtered layers were typically used. The surface was prepared using a general solvent cleaning followed by 24 hour UV-ozone cleaning.

Co-Deposited Aluminum-Silicon Layers

We have co-deposited layers of aluminum-silicon up to 1 micron thick, and in various ratios from 10 atomic % silicon to 40 atomic % silicon onto aluminum substrates. The samples were then subjected to multiple ion beam pulses (25 ion beam pulses can ensure reasonable homogeneity of the alloying in the treated layer) of nitrogen. The fluence window was quite large, anywhere from 1 J/cm$^2$ to 4 J/cm$^2$. Nanoindentation measurements to determine hardness have resulted in a uniform factor two increase in hardness in aluminum-silicon layers treated within the 1 J/cm$^2$ to 4 J/cm$^2$ fluence window indicated above. However, local durability tests using a reciprocating tribometer indicate that wear durability enhancement may be highly localized and dependent on the treatment ion for the same level of fluence.

Transition Metals in Al-6061; Alloy

The present invention has allowed mixing a number of transition metals (titanium, zirconium, hafnium, chromium, niobium, etc.) into a base Al6061-T6 alloy, in concentrations of the order of ten percent and extending down several microns into the substrate, as verified by Rutherford Backscatter Spectrometry (RBS) observations. Under electrochemical impedance testing, these samples have shown a resistance to corrosion several orders of magnitude better than that exhibited by base untreated 6061 alloy, and within an order of magnitude of 99.999% pure aluminum. In addition, the present invention has allowed mixture of both pure and co-sputtered layers of silicon into base 6061 alloy, and produced a factor 3 improvement in surface hardness, as well as improved wear ability.

The treatment regime comprised 25 to 50 ion beam pulses, with the best results obtained with a nitrogen beam at fluence levels of about 4 J cm$^2$. Hafnium and tantalum coatings demonstrated the best improvements in surface properties. Coating thicknesses greater than 600 Å provided similar surface property improvements. 2000 Å coating thickness can help ensure adequate window for coverage.

Addition of Chromium to Iron and Iron-based Alloys (E. G. STAINLESS STEEL)

The present invention has allowed the mixture of pure chromium layers into iron-based substrates, and produced substantial improvements in pitting and passivation behavior. In one case, a pure layer of chromium mixed into high purity iron produced a passivation curve like that exhibited by stainless steel that has itself been modified and improved by ion beam treatment.

The treatment regime comprised 25–50 ion beam pulses of nitrogen, at 3–4 J/cm$^2$ fluence. Coating thickness was as high as 4 microns. For certain coatings (e.g. rhenium), UV-ozone cleaning is necessary. Other coatings have displayed no detriment from treatment without first UV-ozone surface cleaning.

The particular sizes and equipment discussed above are cited merely to illustrate particular embodiments of the invention. It is contemplated that the use of the invention may involve components having different sizes and characteristics. It is intended that the scope of the invention be defined by the claims appended hereto.

We claim:

1. A method for modifying a surface of a substrate, wherein said substrate comprises titanium comprising:

a) applying a coating of a first material onto said surface, wherein said first material comprises platinum; and b) subjecting the coated surface to an ion beam, where the ion beam is characterized by a total number of pulses, an ion content, and a fluence level.

2. A method for modifying a surface of a substrate, comprising:

a) applying a coating of a first material onto said surface; and b) subjecting the coated surface to an ion beam, where the ion beam is characterized by a total number of pulses, an ion content, and a fluence level, wherein the total number of pulses is at least 25, the ion content comprises nitrogen, and the fluence level is between 1.5 J/cm$^2$ and 3 J/cm$^2$.

3. A method for modifying a surface of a substrate, wherein said substrate comprises aluminum comprising:

a) applying a coating of a first material onto said surface, wherein said first material comprises a combination of aluminum and silicon; and b) subjecting the coated surface to an ion beam, where the ion beam is characterized by a total number of pulses, an ion content, and a fluence level.

4. The method of claim 3, wherein the total number of pulses is at least 25, the ion content comprises nitrogen, and the fluence level is between 1 J/cm$^2$ and 4 J/cm$^2$.

5. A method for modifying a surface of a substrate, wherein said substrate consists of iron or iron-based alloy comprising:
  a) applying a coating of a first material onto said surface, wherein said first material comprises chromium; and
  b) subjecting the coated surface to an ion beam, where the ion beam is characterized by a total number of pulses, an ion content, and a fluence level.

6. The method of claim 5, wherein the total number of pulses is at least 25, the ion content comprises nitrogen, and the fluence level is between 3 J/cm$^2$ and 4 J/cm$^2$.

7. A method for modifying a surface of a substrate, wherein said substrate comprises a material selected from the group consisting of iron, aluminum, and titanium, comprising:
  a) applying a coating of a first material onto said surface, wherein said first material comprises platinum, niobium or palladium; and
  b) subjecting the coated surface to an ion beam, where the ion beam is characterized by a total number of pulses, an ion content, and a fluence level.

8. A method for modifying a surface of a substrate, wherein said substrate consists of a material selected from the group consisting of iron, or iron-based alloy titanium, and titanium-based alloy comprising:
  a) applying a coating of a first material onto said surface, wherein said first material comprises a transition metal; and
  b) subjecting the coated surface to an ion beam, where the ion beam is characterized by a total number of pulses, an ion content, and a fluence level.

* * * * *